United States Patent
Wei et al.

(10) Patent No.: US 10,163,853 B2
(45) Date of Patent: Dec. 25, 2018

(54) FORMATION METHOD OF CHIP PACKAGE

(71) Applicant: TAIWAN SEMICONDUCTOR MANUFACTURING CO., LTD., Hsinchu (TW)

(72) Inventors: Wen-Hsin Wei, Hsinchu (TW); Chi-Hsi Wu, Hsinchu (TW); Chen-Hua Yu, Hsinchu (TW); Hsien-Pin Hu, Zhubei (TW); Shang-Yun Hou, Zhubei (TW); Wei-Ming Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/794,277

(22) Filed: Oct. 26, 2017

(65) Prior Publication Data

US 2018/0047703 A1 Feb. 15, 2018

Related U.S. Application Data

(62) Division of application No. 14/981,458, filed on Dec. 28, 2015, now Pat. No. 9,818,720.

(Continued)

(51) Int. Cl.
| | |
|---|---|
| *H01L 23/48* | (2006.01) |
| *H01L 25/065* | (2006.01) |
| *H01L 23/498* | (2006.01) |
| *H01L 25/00* | (2006.01) |
| *H01L 21/48* | (2006.01) |

(Continued)

(52) U.S. Cl.
CPC ........ *H01L 25/0652* (2013.01); *H01L 21/486* (2013.01); *H01L 23/49827* (2013.01); *H01L 25/50* (2013.01); *H05K 3/363* (2013.01); *H01L 23/49816* (2013.01); *H01L 23/49833* (2013.01); *H01L 25/18* (2013.01); *H01L 2224/16145* (2013.01); *H01L 2225/06513* (2013.01); *H01L 2225/06517* (2013.01); *H01L 2225/06541* (2013.01)

(58) Field of Classification Search
CPC ............... H01L 25/0652; H01L 21/486; H01L 23/49827; H01L 25/50; H01L 25/18; H01L 2224/16145; H01L 2225/06517; H05K 3/363
USPC ........................................................ 257/774
See application file for complete search history.

(56) References Cited

U.S. PATENT DOCUMENTS

| | | | |
|---|---|---|---|
| 6,269,866 B1 | 8/2001 | Yamamoto et al. | |
| 2007/0138916 A1* | 6/2007 | Koyama | ............. H03H 9/0542 310/348 |

(Continued)

*Primary Examiner* — Dzung Tran
(74) *Attorney, Agent, or Firm* — Birch, Stewart, Kolasch & Birch, LLP

(57) ABSTRACT

Formation methods of a chip package are provided. The method includes bonding a first chip structure and a second chip structure over a substrate. The method also includes forming a release film to cover top surfaces of the first chip structure and the second chip structure. The method further includes forming a package layer to surround the first chip structure and the second chip structure after the formation of the release film. In addition, the method includes removing the release film such that the top surface of the first chip structure, the top surface of the second chip structure, and a top surface of the package layer are exposed.

20 Claims, 12 Drawing Sheets

Related U.S. Application Data

(60) Provisional application No. 62/188,169, filed on Jul. 2, 2015.

(51) Int. Cl.
*H05K 3/36* (2006.01)
*H01L 25/18* (2006.01)

(56) References Cited

U.S. PATENT DOCUMENTS

| | | | |
|---|---|---|---|
| 2007/0273018 A1* | 11/2007 | Onozuka | B81C 1/0023 257/690 |
| 2008/0122067 A1* | 5/2008 | Wang | H01L 23/4334 257/706 |
| 2009/0212420 A1* | 8/2009 | Hedler | H01L 21/56 257/737 |
| 2009/0267194 A1* | 10/2009 | Chen | H01L 21/76898 257/621 |
| 2010/0110647 A1* | 5/2010 | Hiew | H01L 21/565 361/752 |
| 2011/0248305 A1* | 10/2011 | Ling | H01L 33/505 257/98 |
| 2012/0193779 A1 | 8/2012 | Lee et al. | |
| 2013/0043581 A1* | 2/2013 | Negoro | H01L 23/13 257/712 |
| 2013/0082235 A1 | 4/2013 | Gu et al. | |
| 2013/0256857 A1 | 10/2013 | Gruber et al. | |
| 2014/0264821 A1 | 9/2014 | Tang et al. | |
| 2015/0108628 A1* | 4/2015 | Yu | H01L 23/42 257/712 |

\* cited by examiner

FORMATION METHOD OF CHIP PACKAGE

PRIORITY CLAIM AND CROSS-REFERENCE

This Application is a Divisional of U.S. application Ser. No. 14/981,458, filed on Dec. 28, 2015, the entirety of which is incorporated by reference herein. U.S. application Ser. No. 14/981,458 claims the benefit of U.S. Provisional Application No. 62/188,169, filed on Jul. 2, 2015, the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
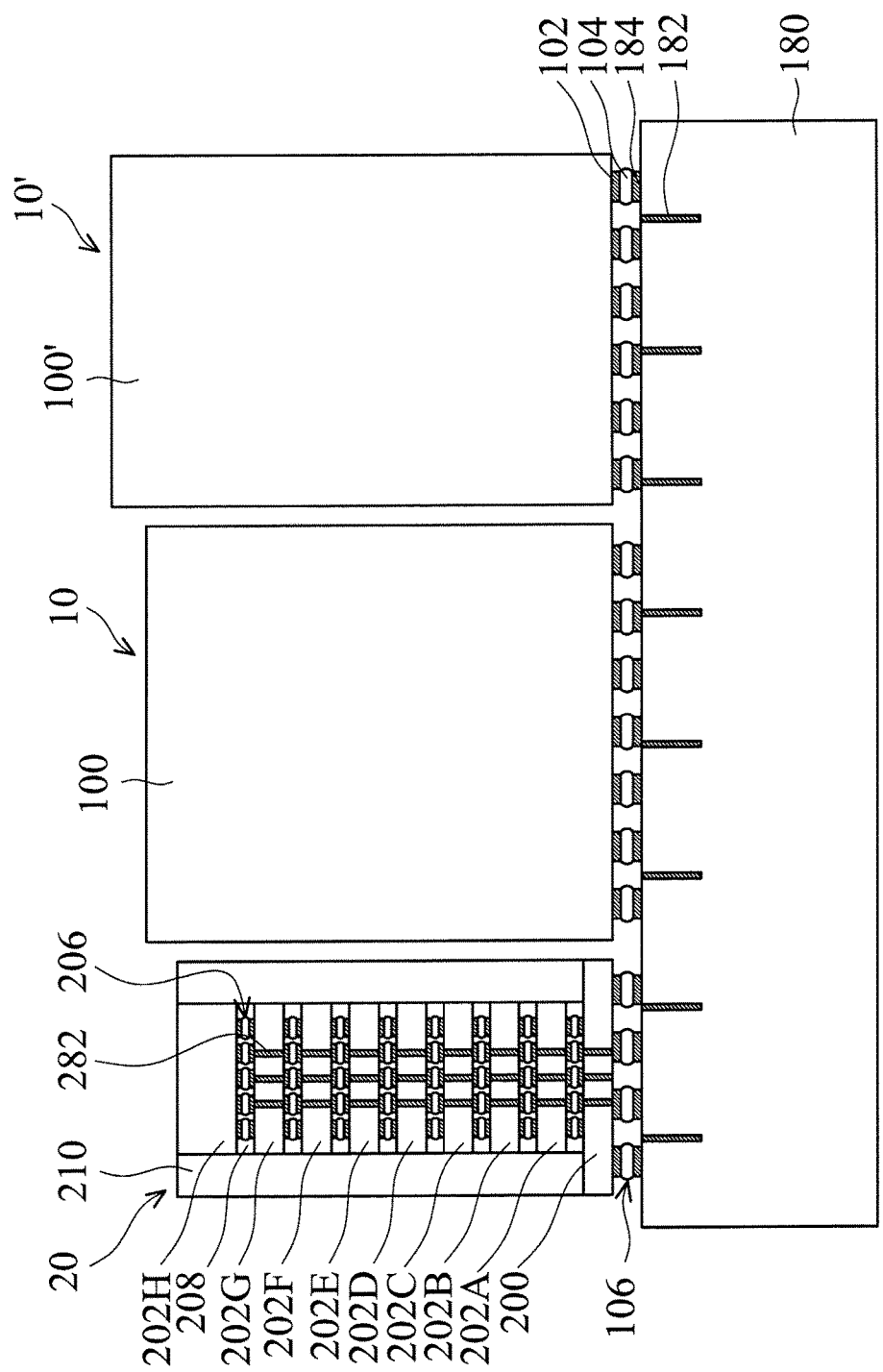
FIGS. 1A-1F are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are cross-sectional views of various stages of a process for forming a chip package, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, chip structures 10, 10' and 20 are bonded over a substrate 180, in accordance with some embodiments. In some embodiments, the chip structure 10' is higher than the chip structure 10, and the chip structure 10 is higher than the chip structure 20. In some embodiments, the top surface of the chip structure 10' is higher than that of the chip structure 10, as shown in FIG. 1A. In some embodiments, the top surface of the chip structure 10 is higher than that of the chip structure 20.

In some embodiments, the chip structure 10 is a single semiconductor chip. In some embodiments, the chip structure 10 includes a semiconductor substrate 100 and an interconnection structure (not shown) formed on the semiconductor substrate 100. For example, the interconnection structure is formed on a bottom surface that faces the substrate 180. The interconnection structure includes multiple interlayer dielectric layers and multiple conductive features formed in the interlayer dielectric layers. These conductive features include conductive lines, conductive vias, and conductive contacts. Some portions of the conductive features may be used as conductive pads.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected through the interconnection structure to form integrated circuit devices. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the chip structure 10 is a system-on-chip (SoC) chip that includes multiple functions.

In some embodiments, the chip structure 10' is similar to the chip structure 10. The chip structure 10' includes a semiconductor substrate 100' and an interconnection structure (not shown) formed on the semiconductor substrate 100'. For example, the interconnection structure is formed on a bottom surface that faces the substrate 180. In some embodiments, the chip structure 10' is a SoC chip that includes multiple functions. In some embodiments, some or all of the multiple functions of the chip structures 10 and 10' are different from each other.

In some embodiments, the chip structure 20 includes multiple semiconductor dies that are stacked. As shown in FIG. 1A, the chip structure 20 includes semiconductor dies 200, 202A, 202B, 202C, 202D, 202E, 202F, 202G, and 202H. In some embodiments, the chip structure 20 includes a molding compound layer 210 that encapsulates and protects these semiconductor dies. The molding compound layer 210 may include an epoxy-based resin with fillers dispersed therein. The fillers may include insulating fibers, insulating particles, other suitable elements, or a combination thereof.

In some embodiments, the semiconductor dies 202A, 202B, 202C, 202D, 202E, 202F, 202G, and 202H are memory dies. The memory dies may include memory devices such as static random access memory (SRAM) devices, dynamic random access memory (DRAM) devices, other suitable devices, or a combination thereof. In some embodiments, the semiconductor die 200 is a control die that is electrically connected to the memory dies stacked thereon. The chip structure 20 may function as a high bandwidth memory (HBM).

Many variations and/or modifications can be made to embodiments of the disclosure. In some embodiments, the chip structure 20 includes a single semiconductor chip. The semiconductor chip may be a SoC chip.

In some embodiments, conductive bonding structures 206 are formed between these semiconductor dies 200, 202A, 202B, 202C, 202D, 202E, 202F, 202G, and 202H to bond them together, as shown in FIG. 1A. In some embodiments, each of the conductive bonding structures 206 includes metal pillars and/or solder bumps. In some embodiments, underfill elements 208 are formed between these semiconductor dies to surround and protect the conductive bonding structures 206. In some embodiments, the underfill element 208 includes an epoxy-based resin with fillers dispersed therein. The fillers may include insulating fibers, insulating particles, other suitable elements, or a combination thereof. In some embodiments, the size and/or density of the fillers dispersed in the underfill element 208 is smaller than those dispersed in the molding compound layer 210.

In some embodiments, multiple conductive features 282 are formed in some of the semiconductor dies in the chip structure 20, as shown in FIG. 1A. Each of the conductive features 282 penetrates through one of the semiconductor dies 200, 202A, 202B, 202C, 202D, 202E, 202F, 202G, and 202H and is electrically connected to one of the conductive bonding structures 206. The conductive features 282 are used as through substrate vias (TSVs). Electrical signals can be transmitted between these vertically stacked semiconductor dies through the conductive features 282.

As shown in FIG. 1A, the chip structures 10, 10' and 20 are bonded onto the substrate 180 through conductive bonding structures 106, in accordance with some embodiments. In some embodiments, the conductive bonding structures 106 include solder bumps, metal pillar bumps, other suitable structures, or a combination thereof. In some embodiments, each of the conductive bonding structures 106 includes a metal pillar bump 102, a solder element 104, and a metal pillar bump 184, as shown in FIG. 1A. For example, the metal pillar bumps 102 and 184 are substantially made of copper.

In some embodiments, a number of metal pillar bumps 102 are formed over the bottom surfaces of the chip structures 10, 10' and 20. In some embodiments, a number of metal pillar bumps 184 are formed over the substrate 180 before the bonding with the chip structures 10, 10' and 20.

In some embodiments, solder material, such as solder paste, is applied on one or both of the metal pillar bumps 102 and 184 before the bonding process. Afterwards, the metal pillar bumps 102 and 184 are bonded together through the solder material. The solder material forms the solder elements 104 between the metal pillar bumps 102 and 184. As a result, the conductive bonding structures 106 are formed, as shown in FIG. 1A. In some embodiments, the solder material is an alloy material that includes tin (Sn). The solder material also includes another element. The element may include lead, silver, copper, nickel, bismuth, another suitable element, or a combination thereof. In some embodiments, the solder material does not include lead.

In some embodiments, the substrate 180 includes a semiconductor material, a ceramic material, an insulating material, a polymer material, another suitable material, or a combination thereof. In some embodiments, the substrate 180 is a semiconductor substrate. The semiconductor substrate may be a semiconductor wafer, such as a silicon wafer.

As shown in FIG. 1A, a number of conductive features 182 are formed in the substrate 180, in accordance with some embodiments. In some embodiments, the conductive features 182 are formed before the formation of the metal pillar bumps 184. In some embodiments, each of the conductive features 182 is electrically connected to one of the metal pillar bumps 184 that are then formed. Interconnection structures (not shown) including, for example, redistribution layers may be used to form electrical connections between the conductive features 182 and the metal pillar bumps 184. In some embodiments, insulating elements (not shown) are formed between the conductive features 182 and the substrate 180 to prevent short circuiting between different conductive features 182. In some other embodiments, the substrate 180 is an insulating substrate. In these cases, the insulating elements may not be formed.

In some embodiments, the conductive features 182 are made of copper, aluminum, titanium, tungsten, cobalt, gold, platinum, another suitable material, or a combination thereof. In some embodiments, the insulating elements are made of silicon oxide, silicon nitride, silicon oxynitride, silicon carbide, another suitable material, or a combination thereof. In some embodiments, one or more photolithography and etching processes are used to form a number of openings that define the positions of the conductive features 182. Afterwards, an insulating layer and a conductive layer are sequentially deposited over the substrate 180 to fill the openings. A planarization process is then performed to remove the portions of the insulating layer and the conductive layer outside of the openings. As a result, the remaining portions of the insulating layer and the conductive layer in the openings form the insulating elements and the conductive features 182, respectively.

Figure 1B:
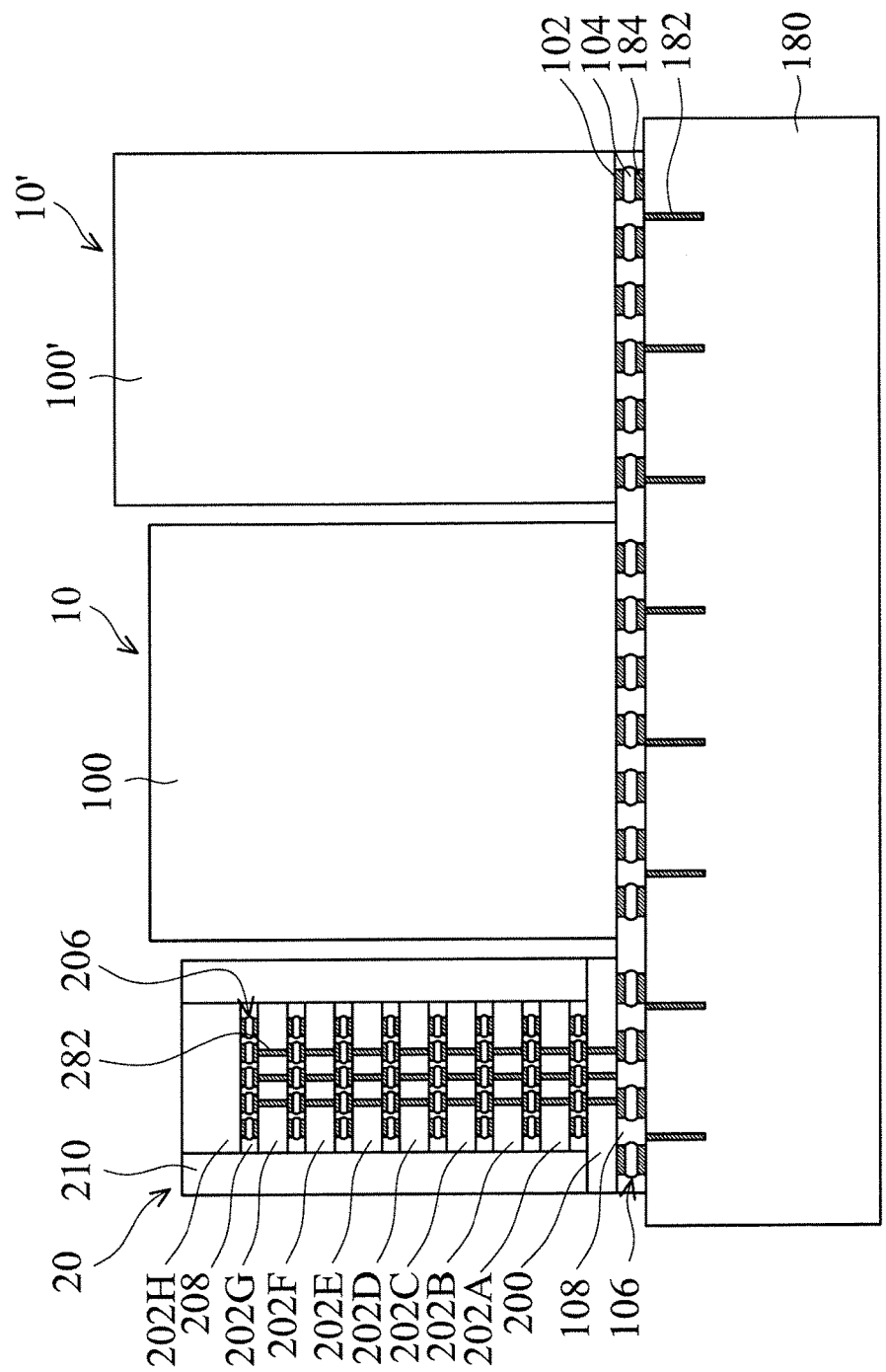

As shown in FIG. 1B, an underfill layer 108 is formed to surround and protect the conductive bonding structures 106, in accordance with some embodiments. In some embodiments, the underfill layer 108 is in direct contact with the conductive bonding structures 106. In some embodiments, a liquid underfill material is dispensed by capillary action and cured to form the underfill layer 108. In some embodiments, the underfill layer 108 includes an epoxy-based resin with fillers dispersed therein. The fillers may include fibers, particles, other suitable elements, or a combination thereof.

Figure 1C:
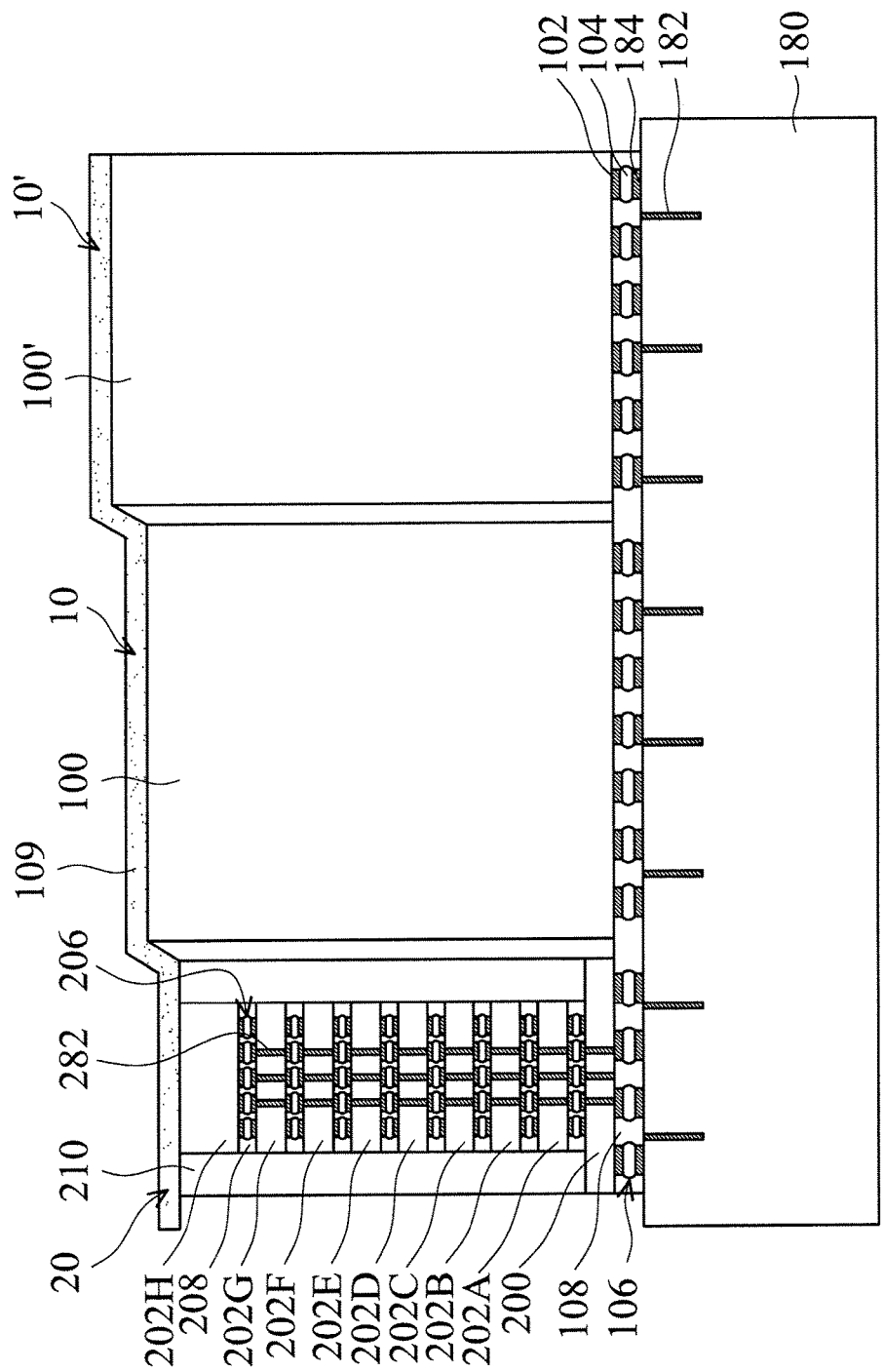

As shown in FIG. 1C, a release film 109 is formed to cover the top surfaces of the chip structures 10, 10' and 20, in accordance with some embodiments. In some embodiments, the release film 109 is attached on the top surfaces of the chip structures 10, 10' and 20. In some embodiments, the release film 109 can be easily removed from the chip structures 10, 10' and 20. In some embodiments, the release film 109 can be removed from the chip structures 10, 10' and 20 through light irradiation, such as ultraviolet (UV) light irradiation or laser irradiation.

Figure 1D:
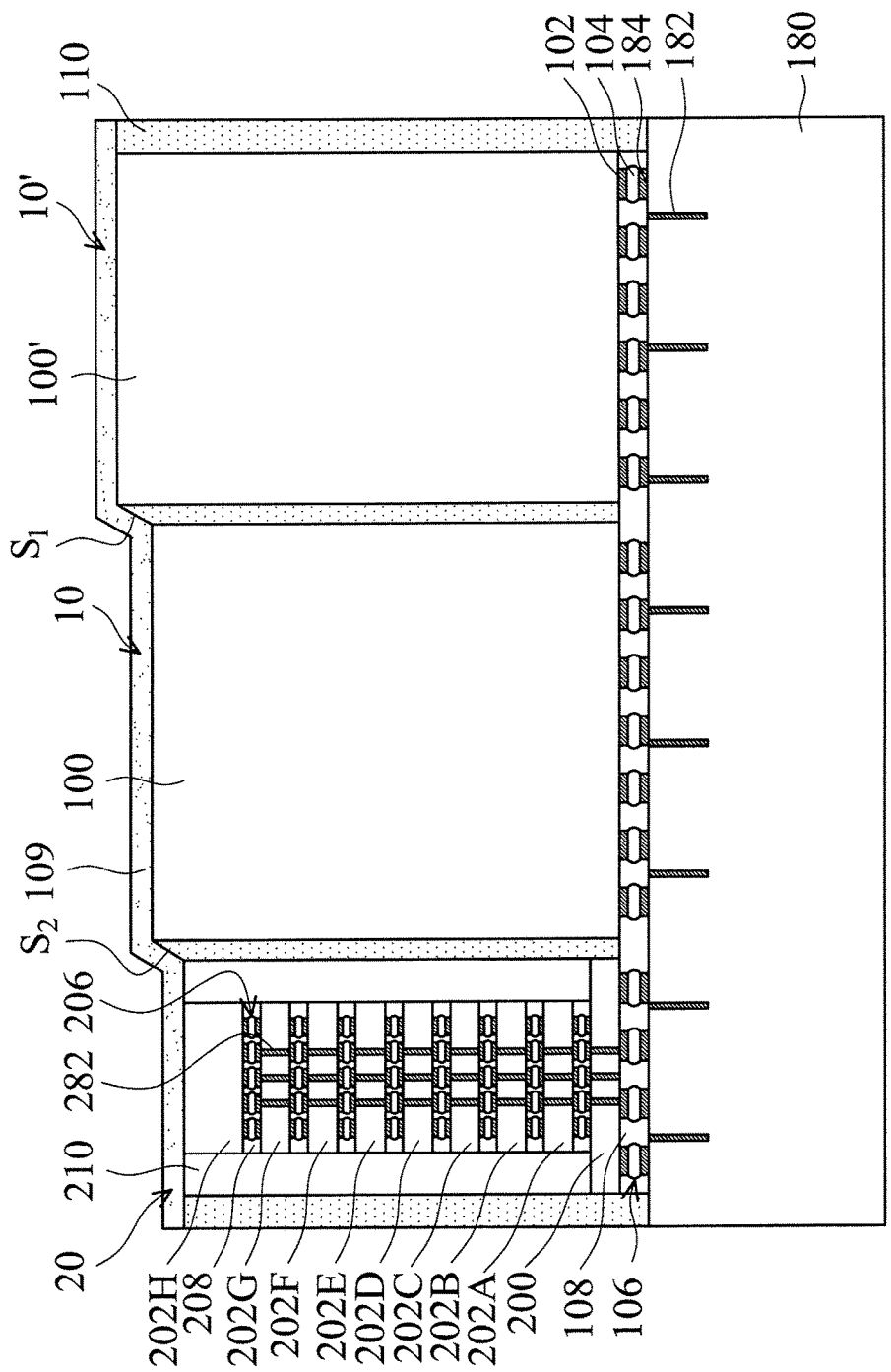

As shown in FIG. 1D, a package layer 110 is formed between the release film 109 and the substrate 180 to surround and/or encapsulate the chip structures 10, 10' and 20, in accordance with some embodiments. In some embodiments, the package layer 110 fills space surrounded by the chip structures 10, 10', and 20, the release film 109, and the substrate 180. In some embodiments, the package layer 110 is in direct contact with the underfill layer 108. In some embodiments, the package layer 110 is not in direct contact with the conductive bonding structures 106. In some embodiments, the package layer 110 is in direct contact with the molding compound layer 210 of the chip structure 20.

In some embodiments, the package layer 110 includes a polymer material. In some embodiments, the package layer 110 is a molding compound layer. The molding compound layer may include an epoxy-based resin with fillers dispersed therein. The fillers may include insulating fibers, insulating particles, other suitable elements, or a combination thereof. In some embodiments, the size and/or density of the fillers dispersed in the package layer 110 is greater than those dispersed in the underfill layer 108.

In some embodiments, a liquid molding compound material is dispensed into the space between the release film 109 and the substrate 180. For example, the liquid molding compound is dispensed by capillary action. Afterwards, a thermal operation is applied to cure the liquid molding compound material. As a result, the liquid molding compound material is hardened and transformed into the package layer 110. In some embodiments, the thermal operation is performed at a temperature in a range from about 200 degrees C. to about 230 degrees C. The operation time of the thermal operation may be in a range from about 1 hour to about 3 hours.

In some embodiments, the package layer 110 covers the sidewalls of the chip structures 10, 10' and 20, as shown in FIG. 1D. In some embodiments, the top surface of the chip structures 10, 10' and 20 are not covered by the package layer 110. Due to the release film 109, the liquid molding compound material is prevented from covering the top surfaces of the chip structures 10, 10' and 20. Therefore, the top surfaces of the chip structures 10, 10' and 20 are not covered by the package layer 110, as shown in FIG. 1D in accordance with some embodiments.

In some embodiments, the package layer 110 has slanted surfaces $S_1$ and $S_2$, for example, relative to a top surface of the chip structure 10, as shown in FIG. 1D. In some embodiments, the slanted surface $S_1$ connects the top surfaces of the chip structures 10' and 10. In some embodiments, the slanted surface $S_2$ connects the top surfaces of the chip structures 10 and 20. In some embodiments, the slanted surfaces $S_1$ and $S_2$ are planar surfaces. In some other embodiments, the slanted surfaces $S_1$ and $S_2$ include curved portions.

Figure 1E:
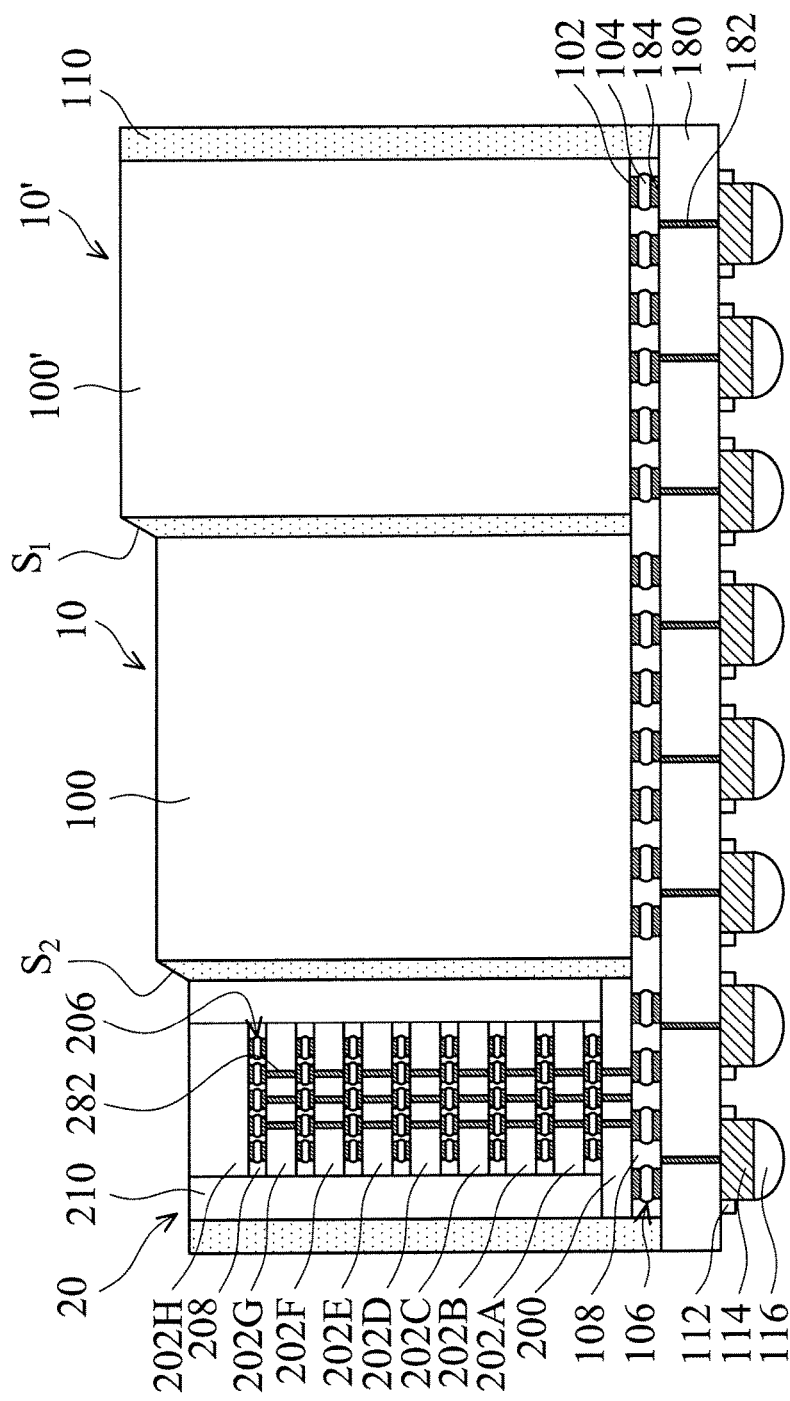

As shown in FIG. 1E, the release film 109 is removed or detached from the chip structures 10, 10', and 20 and the package layer 110, in accordance with some embodiments. Afterwards, the substrate 180 is thinned to expose the conductive features 182, as shown in FIG. 1E in accordance with some embodiments. In some embodiments, each of the conductive features 182 penetrates through the substrate 180. In some embodiments, each of the conductive features 182 is electrically connected to one of the conductive bonding structures 106.

In some embodiments, the structure shown in FIG. 1E is turned upside down. In some embodiments, carrier glue (not shown) is applied on the top surfaces of the chip structures 10, 10' and 20 and the package layer 110 to provide a substantially planar surface. The carrier glue with the substantially planar surface may facilitate a subsequent thinning process of the substrate 180. Afterwards, the substrate 180 is thinned using a planarization process to expose the conductive features 182. The planarization process may include a CMP process, a grinding process, an etching process, another applicable process, or a combination thereof.

Afterwards, conductive elements are formed over the substrate 180, as shown in FIG. 1E in accordance with some embodiments. In some embodiments, the conductive elements include metal pillars 114 and solder elements 116, as shown in FIG. 1E. However, many variations and/or modifications can be made to embodiments of the disclosure. In some other embodiments, the conductive elements have different structures. For example, the conductive elements do not include metal pillars. The conductive elements may only include solder bumps. In some embodiments, a buffer layer 112 is formed to protect the conductive elements. In some embodiments, each of the metal pillars 114 is electrically connected to one of the conductive features 182. In some embodiments, the carrier glue is then removed.

Figure 1F:
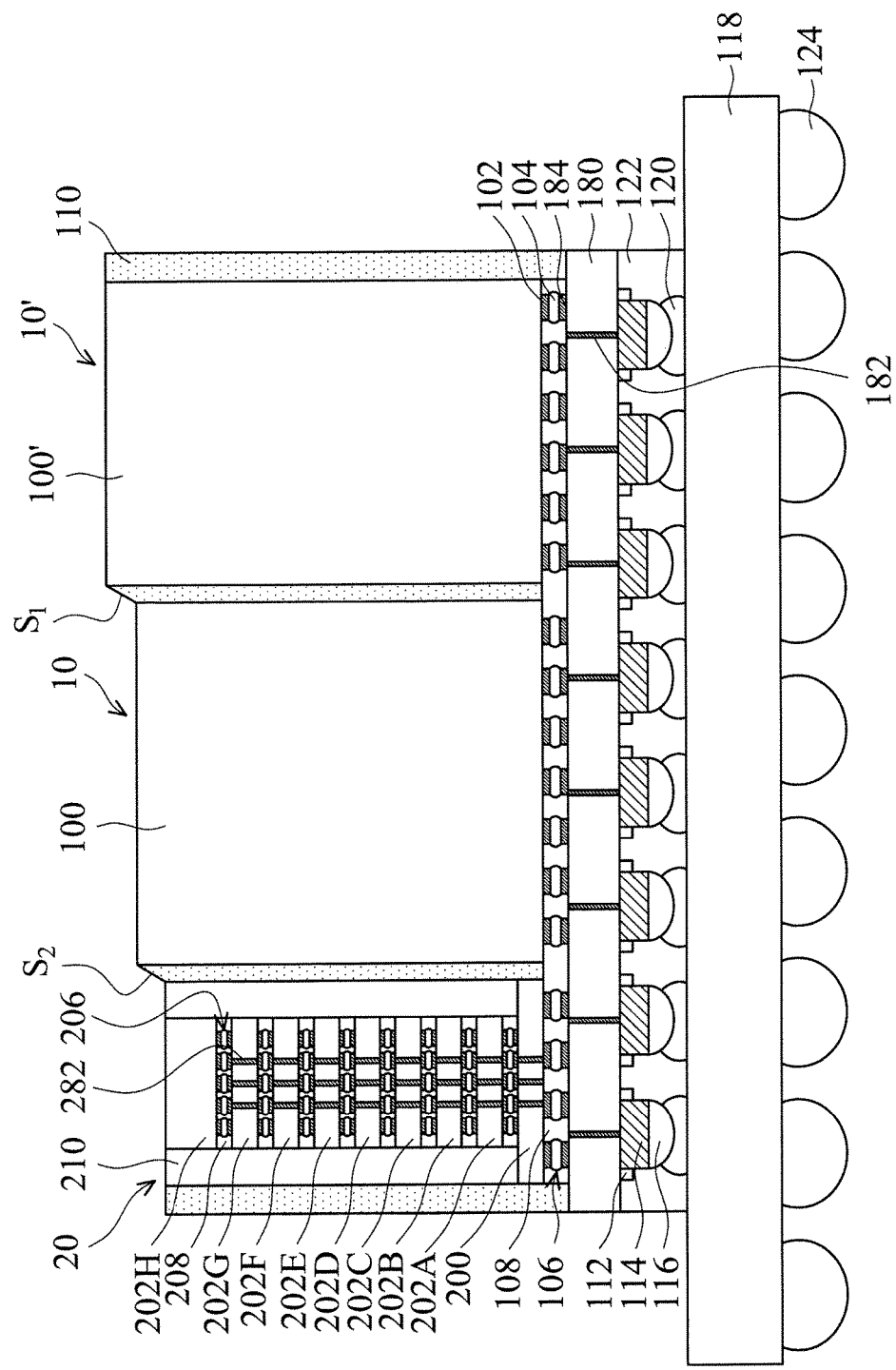

As shown in FIG. 1F, the structure shown in FIG. 1E is bonded onto a substrate 118, in accordance with some embodiments. In some embodiments, the substrate 118 is a circuit board such as a printed circuit board. In some other embodiments, the substrate 118 is a ceramic substrate. In some embodiments, conductive elements 120 and 124 are formed on opposite surfaces of the substrate 118, as shown in FIG. 1F. In some embodiments, the conductive elements 120 and 124 are solder bumps such as controlled collapse chip connection (C4) bumps and/or ball grid array (BGA) bumps. In some embodiments, the conductive elements 120 and the solder elements 116 are reflowed and bonded together, as shown in FIG. 1F.

In some embodiments, each of the conductive elements 120 is electrically connected to one of the conductive elements 124 through conductive features (not shown) formed in the substrate 118. The conductive features may include conductive lines and conductive vias. In some embodiments, an underfill layer 122 is then formed between the substrate 118 and the substrate 180 to protect the conductive bonding structures therebetween.

In some embodiments, there is no planarization process performed on the surfaces of the chip structures 10, 10' and 20 during the formation of the package layer 110. Therefore, the chip structures 10, 10' and 20 are prevented from damage since no planarization process is performed on the chip structures 10, 10' and 20. The reliability and quality of the chip package are significantly improved.

Figure 2:
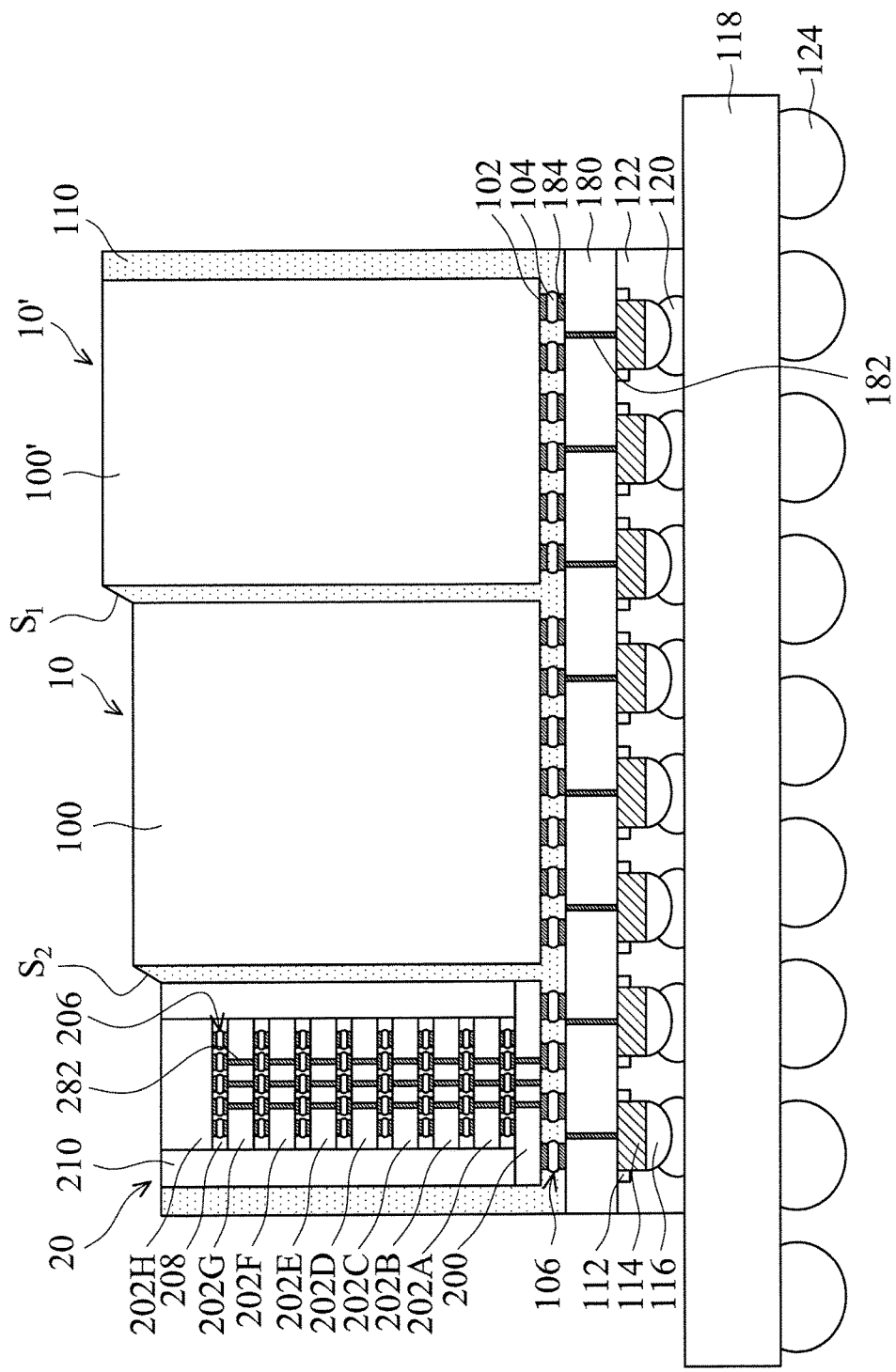
FIG. 2 is a cross-sectional view of a chip package, in accordance with some embodiments.

Many variations and/or modifications can be made to embodiments of the disclosure. FIG. 2 is a cross-sectional view of a chip package, in accordance with some embodiments. In some embodiments, the underfill layer 108 is not formed. In some embodiments, the package layer 110 fills the space between the substrate 180 and the chip structures 10, 10' and 20. The package layer 110 surrounds the conductive bonding structures 106. In some embodiments, since the underfill layer 108 is not formed, the package layer 110 is in direct contact with the conductive bonding structures 106.

In some embodiments, the substrate 180 is used as an interposer. The substrate 180 may be used to improve the structural strength and reliability of the chip package. However, embodiments of the disclosure are not limited thereto. Many variations and/or modifications can be made to embodiments of the disclosure. In some embodiments, the substrate 180 is not formed.

Figure 3A:
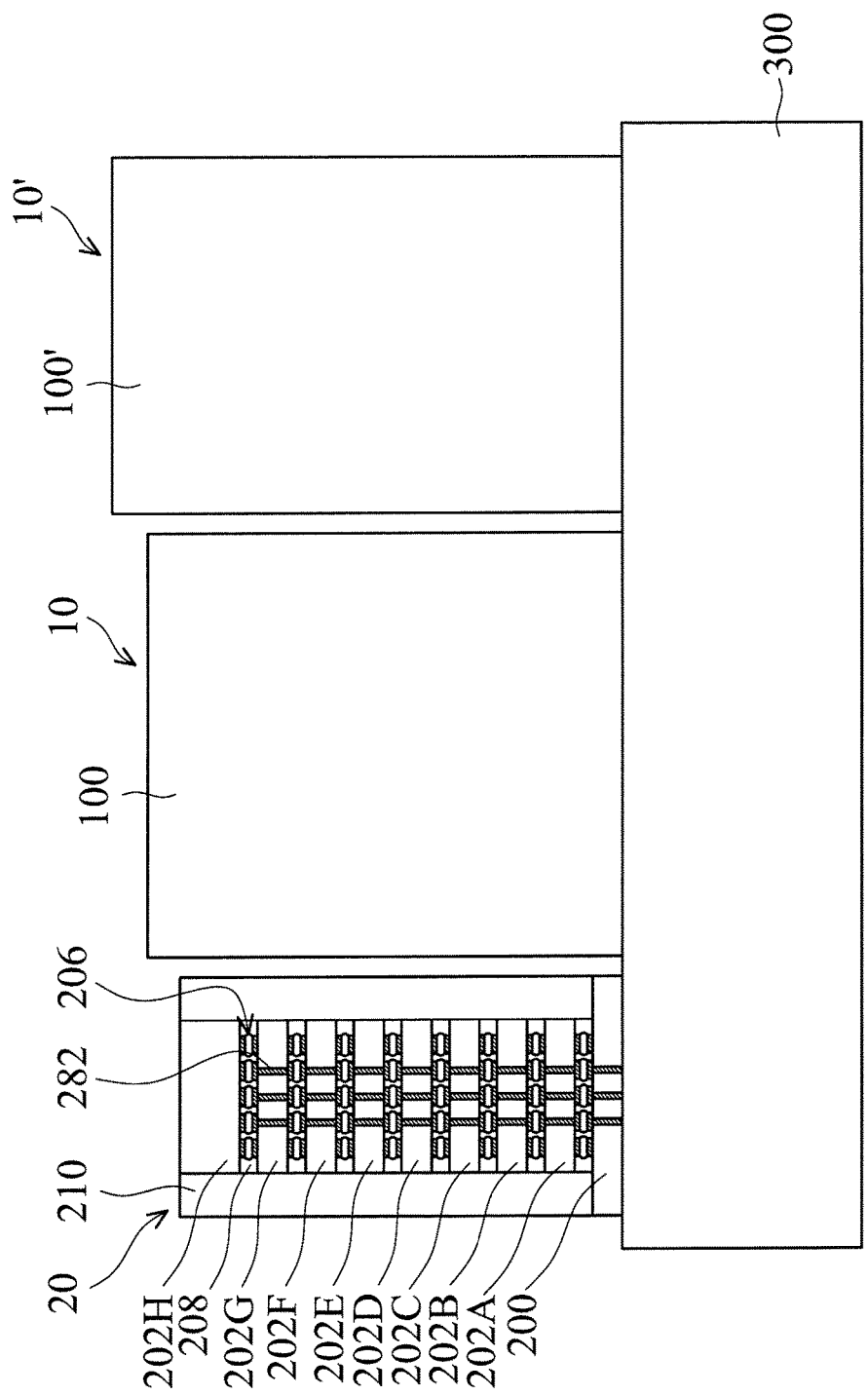
FIGS. 3A-3E are cross-sectional views of various stages of a process for forming a chip package, in accordance with some embodiments.

FIGS. 3A-3E are cross-sectional views of various stages of a process for forming a chip package, in accordance with some embodiments. As shown in FIG. 3A, the chip structures 10, 10' and 20 are attached on a carrier substrate 300, in accordance with some embodiments. An adhesion layer (not shown) may be used to attach the chip structures 10, 10' and 20 onto the carrier substrate 300. In some embodiments, the carrier substrate 300 includes a glass substrate, a ceramic substrate, a semiconductor substrate, a polymer substrate, another suitable substrate, or a combination thereof. In some embodiments, the carrier substrate 300 is a temporary substrate to support the chip structures 10, 10' and 20 during subsequent processes. Afterwards, the carrier substrate 300 may be removed.

Figure 3B:
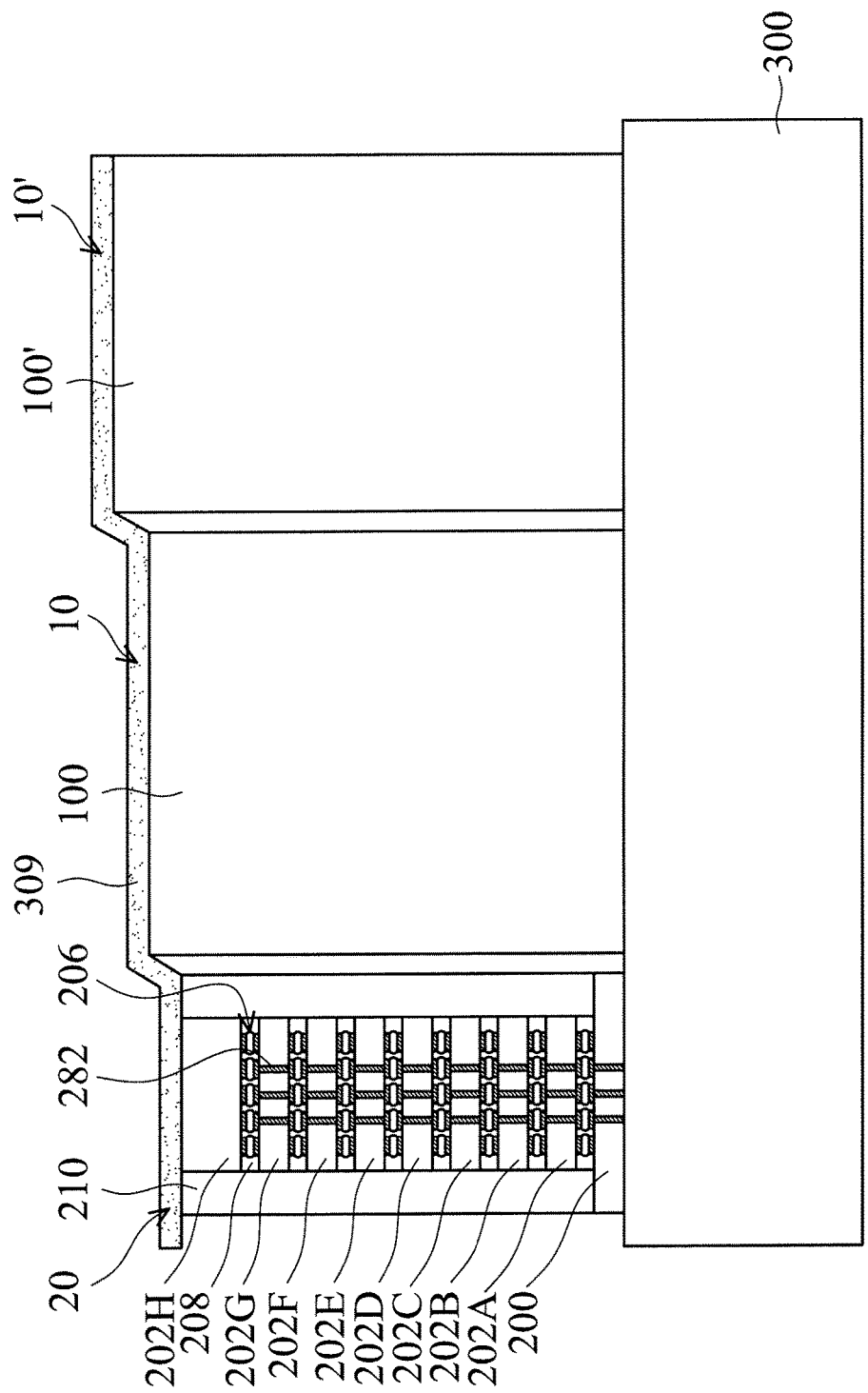

As shown in FIG. 3B, a blocking film 309 is formed to cover the top surfaces of the chip structures 10, 10' and 20, in accordance with some embodiments. In some embodiments, the blocking film 309 is attached on the top surfaces of the chip structures 10, 10' and 20. In some embodiments, the blocking film 309 can be easily removed from the chip structures 10, 10' and 20. In some embodiments, the blocking film 309 can be removed from the chip structures 10, 10' and 20 through light irradiation, such as ultraviolet (UV) light irradiation or laser irradiation.

Figure 3C:
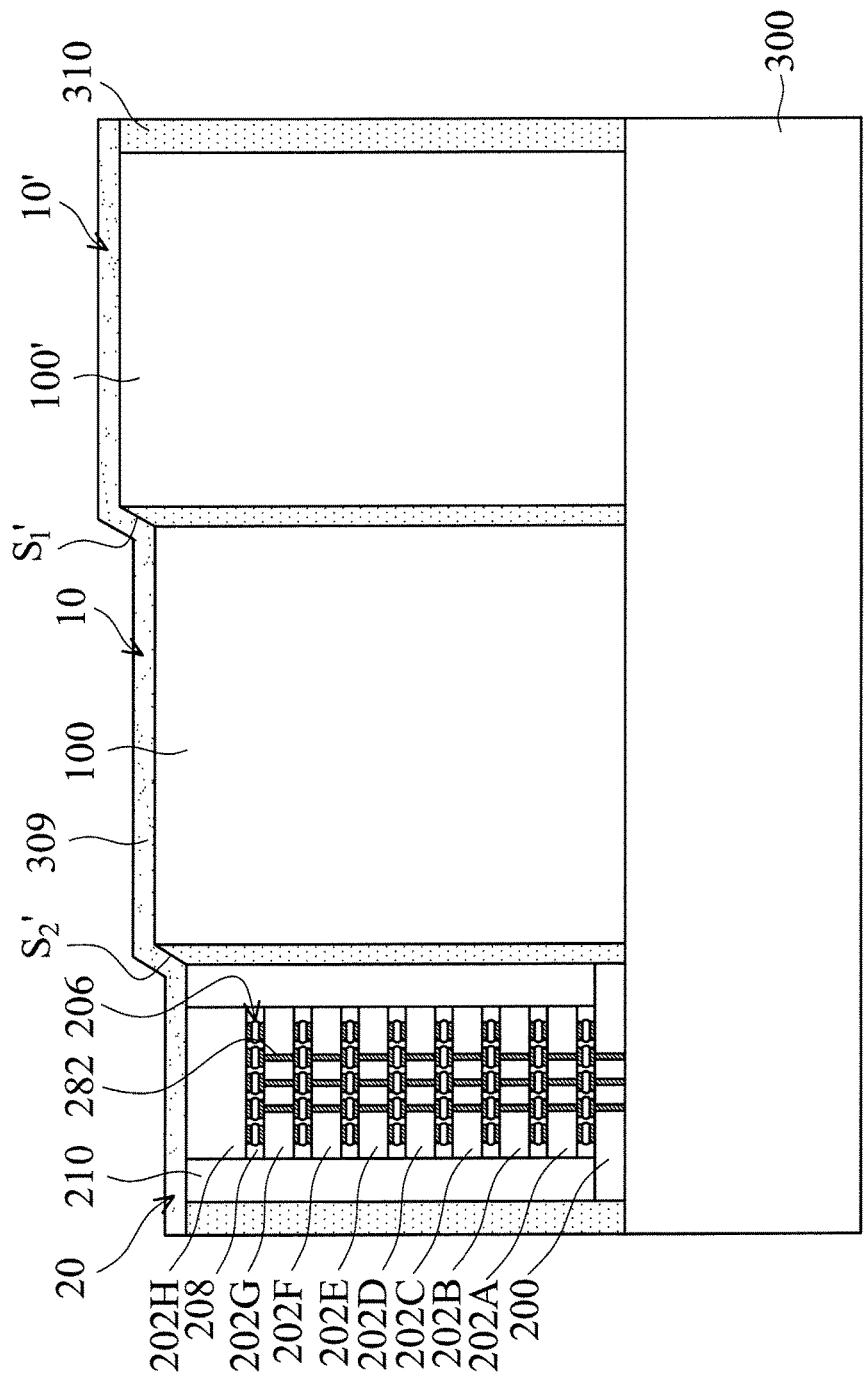

As shown in FIG. 3C, a package layer 310 is formed between the carrier substrate 300 and the blocking film 310 to encapsulate the chip structures 10, 10' and 20, in accordance with some embodiments. In some embodiments, the package layer 310 fills gaps between the chip structures 10, 10', and 20. In some embodiments, the package layer 310 is in direct contact with the molding compound layers 210 of the chip structure 20. In some embodiments, the material and formation method of the package layer 310 are similar to those of the package layer 110. In some embodiments, the blocking layer 309 is then removed.

In some embodiments, the package layer 310 covers the sidewalls of the chip stacks 10, 10' and 20, as shown in FIG. 3C. In some embodiments, due to the blocking layer 310, the top surfaces of the chip structures 10, 10', and 20 are not covered by the package layer 310. In some embodiments, similar to the package layer 110, the package layer 310 has slanted surfaces $S_1'$ and $S_2'$, as shown in FIG. 3C.

Figure 3D:
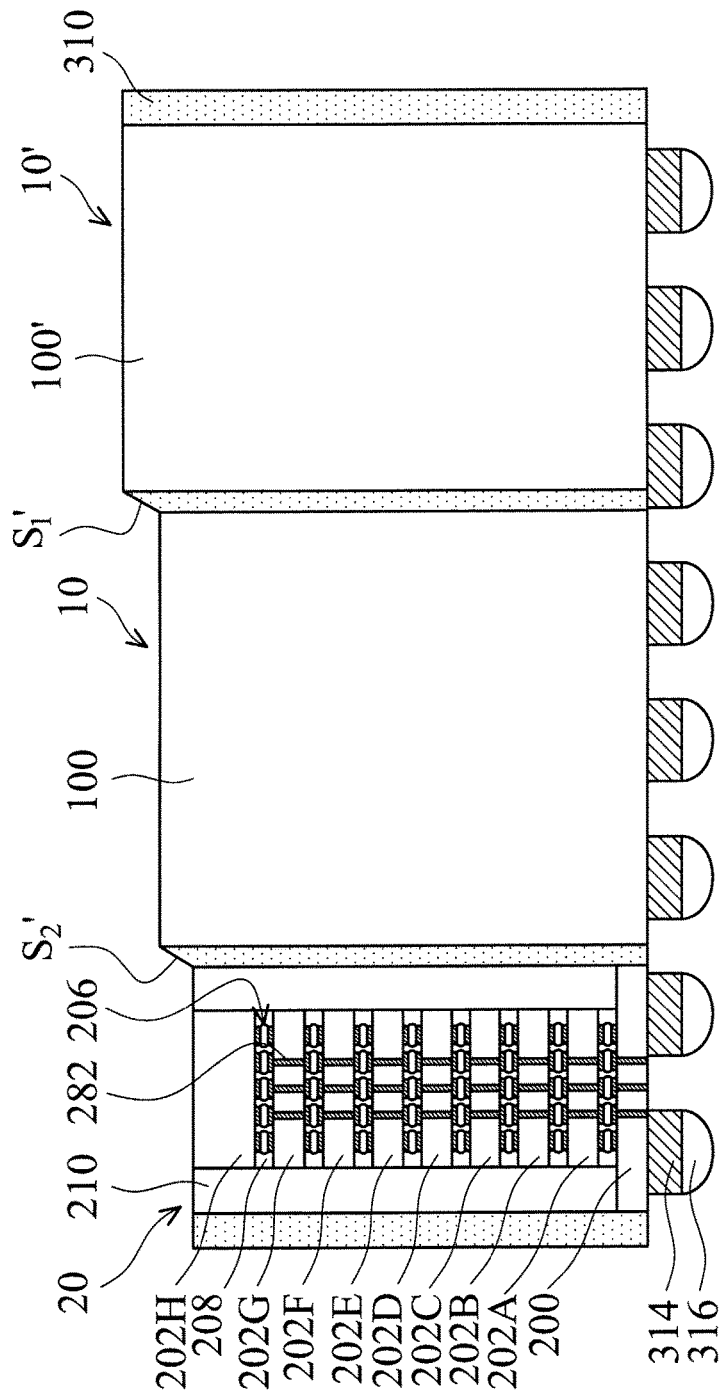

As shown in FIG. 3D, the carrier substrate 300 is removed such that the bottom surfaces of the chip structures 10, 10', and 20, and the package layer 310 are exposed, in accordance with some embodiments. In some embodiments, the bottom surfaces of the chip structures 10, 10', and 20, and the package layer 310 are substantially coplanar with each other.

Afterwards, conductive elements are formed over the bottom surfaces of the chip structures 10, 10' and 20, as shown in FIG. 3D in accordance with some embodiments. In some embodiments, the conductive elements include metal pillars 314 and solder elements 316, as shown in FIG. 3D. In some other embodiments, the conductive elements include other configurations. In some embodiments, a buffer layer (not shown) is formed to protect the conductive elements.

Figure 3E:
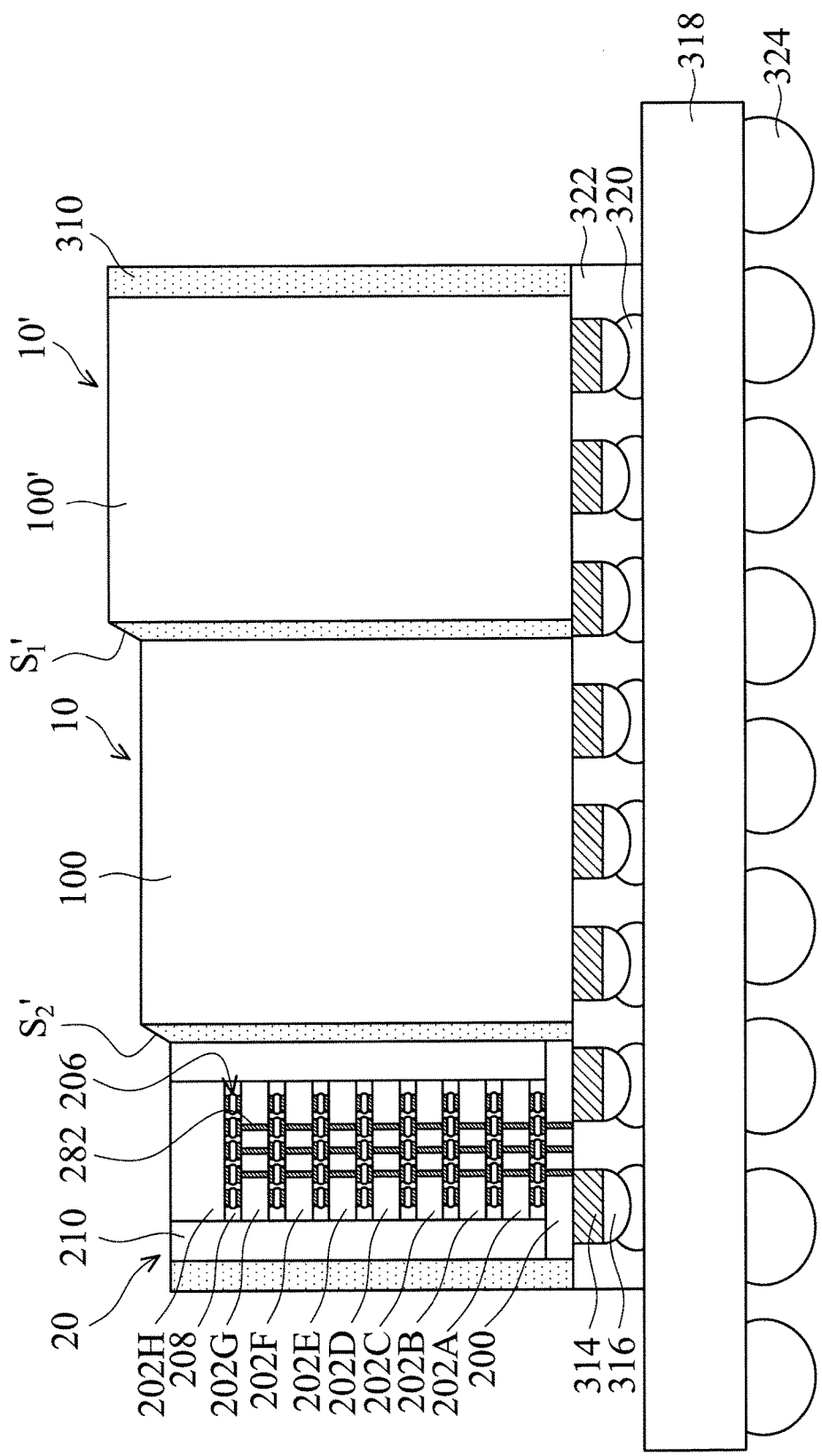

As shown in FIG. 3E, the structure shown in FIG. 3D is bonded onto a substrate 318, in accordance with some embodiments. In some embodiments, the substrate 318 is a circuit board such as a printed circuit board. In some other embodiments, the substrate 318 is a ceramic substrate. In some embodiments, conductive elements 320 and 324 are formed on opposite surfaces of the substrate 318, as shown in FIG. 3E. In some embodiments, the conductive elements 320 and 324 are solder bumps such as controlled collapse chip connection (C4) bumps and/or ball grid array (BGA) bumps. In some embodiments, the conductive elements 320 and the solder elements 316 are reflowed and bonded together, as shown in FIG. 3E.

In some embodiments, each of the conductive elements 320 is electrically connected to one of the conductive elements 324 through conductive features (not shown) formed in the substrate 318. The conductive features may include conductive lines and conductive vias. In some embodiments, an underfill layer 322 is then formed between the substrate 318 and the chips including the chip structures 10, 10' and 20 to protect the conductive bonding structures therebetween. In some embodiments, the package layer 310 is not in direct contact with the conductive bonding structures therebetween.

In some embodiments, there is no planarization process performed on the surfaces of the chip structures 10, 10' and 20 during the formation of the package layer 310. Therefore, the chip structures 10, 10' and 20 are prevented from damage since no planarization process is performed on the chip structures 10, 10' and 20. The reliability and quality of the chip package are significantly improved.

Embodiments of the disclosure form a chip package including chip structures with different heights. A release film (or a blocking film) is attached on the top surfaces of the chip structures. Afterwards, a package layer, such as a molding compound layer, is formed to encapsulate the chip structures. Due to the release film, the top surfaces of the chip structures are not covered by the package layer. There is no planarization process performed on the surfaces of the chip structures during the formation of the package layer. Therefore, the performance and reliability of the chip package are significantly improved.

In accordance with some embodiments, a chip package is provided. The chip package includes a first chip structure and a second chip structure. Heights of the first chip structure and the second chip structure are different. The chip package also includes a package layer covering sidewalls of the first chip structure and sidewalls of the second chip structure. Top surfaces of the first chip structure and the second chip structure are not covered by the package layer.

In accordance with some embodiments, a chip package is provided. The chip package includes a first chip structure and a second chip structure. A top surface of the first chip structure is higher than a top surface of the second chip structure. The chip package also includes a molding compound layer surrounding the first chip structure and the second chip structure. The top surfaces of the first chip structure and the second chip structure are not covered by the molding compound layer.

In accordance with some embodiments, a method for forming a chip package is provided. The method includes bonding a first chip structure and a second chip structure over a substrate. The method also includes forming a release film to cover top surfaces of the first chip structure and the second chip structure. The method further includes forming a release film to cover top surfaces of the first chip structure and the second chip structure. In addition, the method includes removing the release film such that the top surface of the first chip structure, the top surface of the second chip structure, and a top surface of the package layer are exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package, comprising:
    bonding a first chip structure and a second chip structure over a substrate;
    forming a release film to cover top surfaces of the first chip structure and the second chip structure, wherein the release film has a first portion over the first chip structure, a second portion over the second chip structure, and a third portion connecting the first portion and the second portion, wherein the third portion extends downwards from a higher height level to a lower height level;
    forming a package layer to surround the first chip structure and the second chip structure after the formation of the release film; and
    removing the release film such that the top surface of the first chip structure, the top surface of the second chip structure, and a top surface of the package layer are exposed.

2. The method for forming a chip package as claimed in claim 1, wherein the first chip structure and the second chip structure are bonded onto the substrate through a plurality of conductive bonding structures.

3. The method for forming a chip package as claimed in claim 2, further comprising forming an underfill layer to surround the conductive bonding structures before the formation of the package layer.

4. The method for forming a chip package as claimed in claim 2, wherein the package layer fills space between the conductive bonding structures.

5. The method for forming a chip package as claimed in claim 1, further comprising:
    forming a conductive feature in the substrate before the bonding of the first chip structure and the second chip structure; and
    thinning the substrate from a surface of the substrate to expose the conductive feature after the formation of the package layer.

6. The method for forming a chip package as claimed in claim 1, wherein the portion of the release film is a slanted portion connecting the top surfaces of the first chip structure and the second chip structure before the release film is removed.

7. The method for forming a chip package as claimed in claim 1, further comprising:
    dispensing a liquid molding compound material into a space between the release film and the substrate; and
    curing the liquid molding compound material to form the package layer.

8. The method for forming a chip package as claimed in claim 1, wherein a distance between a bottom surface of the first chip structure and the substrate is substantially the same as a distance between a bottom surface of the second chip structure and the substrate.

9. The method for forming a chip package as claimed in claim 1, further comprising bonding a third chip structure over the substrate before the formation of the release film, wherein the third chip structure has a different height than that of the first chip structure or the second chip structure.

10. The method for forming a chip package as claimed in claim 1, wherein the release film is removed through light irradiation.

11. A method for forming a chip package, comprising:
    disposing a first chip structure and a second chip structure over a substrate;
    attaching a release film over the first chip structure and the second chip structure, wherein the release film has a top surface and a bottom surface, and the bottom surface of the release film is between the top surface of the release film and the first chip structure;
    forming a package layer between the release film and the substrate to surround the first chip structure and the second chip structure, wherein a top surface of the package layer is between the bottom surface of the release film and the substrate; and
    removing the release film after the package layer is formed.

12. The method for forming a chip package as claimed in claim 11, wherein top surfaces of the first chip structure and the second chip structure are completely covered by the release film.

13. The method for forming a chip package as claimed in claim 11, wherein the first chip structure has a greater height than the second chip structure, and the release film has a slanted portion connecting top surfaces of the first chip structure and the second chip structure.

14. The method for forming a chip package as claimed in claim 11, further comprising:
    dispensing a liquid molding compound material between the release film and the substrate to surround the first chip structure and the second chip structure; and
    heating the liquid molding compound material to form the package layer.

15. The method for forming a chip package as claimed in claim 11, further comprising:
    forming a conductive feature in the substrate before the first chip structure and the second chip structure are disposed over the substrate; and
    thinning the substrate to expose the conductive feature after the formation of the package layer.

16. A method for forming a chip package, comprising:
    disposing a first chip structure and a second chip structure over a substrate;
    placing a release film directly on top surfaces of the first chip structure and the second chip structure, wherein the top surfaces of the first chip structure and the second chip structure are at different height levels;
    forming a molding compound layer between the release film and the substrate to surround the first chip structure and the second chip structure; and removing the release film after the molding compound layer is formed to expose the top surfaces of the first chip structure and the second chip structure.

17. The method for forming a chip package as claimed in claim 16, wherein the top surfaces of the first chip structure and the second chip structure are not covered by the molding compound layer, a bottom surface of the first chip structure and a bottom surface of the second chip structure are substantially coplanar, and the molding compound layer has a slanted surface connecting the top surfaces of the first chip structure and the second chip structure.

18. The method for forming a chip package as claimed in claim 16, wherein the release film is removed by irradiating with an ultraviolet light.

19. The method for forming a chip package as claimed in claim 16, further comprising disposing a third chip structure over the substrate before the release film is placed, wherein a top surface of the third chip structure is positioned at a different height level than that of the first chip structure or the second chip structure.

20. The method for forming a chip package as claimed in claim 19, wherein the release film covers the top surface of the third chip.

* * * * *